(12) United States Patent
Gruening et al.

(10) Patent No.: US 6,597,555 B2
(45) Date of Patent: Jul. 22, 2003

(54) GATE DRIVER FOR THYRISTOR

(75) Inventors: Horst Gruening, Tokyo (JP); Taichiro Tsuchiya, Tokyo (JP); Fumio Mizohata, Tokyo (JP); Kenshi Takao, Tokyo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 30 days.

(21) Appl. No.: 09/934,645

(22) Filed: Aug. 23, 2001

(65) Prior Publication Data

US 2002/0118503 A1 Aug. 29, 2002

(30) Foreign Application Priority Data

Feb. 27, 2001 (JP) ........................................ 2001-051999

(51) Int. Cl.[7] .............................. H02H 3/00; H02H 7/00; H02H 9/02
(52) U.S. Cl. ....................................................... 361/100
(58) Field of Search ................................ 361/100, 115; 327/440, 442, 438; 307/130

(56) References Cited

U.S. PATENT DOCUMENTS

| 4,115,707 A | * | 9/1978 | Kalfus .......................... 307/252 |
| 4,674,023 A | * | 6/1987 | Peppel et al. .................. 363/57 |
| 4,682,278 A | * | 7/1987 | Marquardt et al. ............ 363/58 |
| 4,791,350 A |   | 12/1988 | Roof |
| 5,077,487 A | * | 12/1991 | Iida ............................... 307/248 |
| 5,534,735 A | * | 7/1996 | Baba et al. .................... 307/117 |
| 6,191,640 B1 | * | 2/2001 | Coenraads et al. ........... 327/443 |

* cited by examiner

Primary Examiner—Brian Sircus
Assistant Examiner—Z Kitov
(74) Attorney, Agent, or Firm—Leydig, Voit & Mayer, Ltd.

(57) ABSTRACT

A signal pattern is generated to produce a current for driving a GCT thyristor. The current is produced by the use of a down converter. Also, a current limiter having an FET is used for protecting the down converter from being damaged by a negative voltage appearing at the gate of GCT when the GCT thyristor receives a reverse direction load current.

12 Claims, 14 Drawing Sheets

GATE DRIVER FOR THYRISTOR

BACKGROUND OF THE INVENTION

1. Field of the Invention

The present invention relates to a gate driver for driving a thyristor, such as a GCT (gate commutated turn-off) thyristor, a GTO (gate turn-off) thyristor, a static inductive thyristor (SITH), or a power transistor, in a stable condition.

2. Prior Art

GCT On-State Gate Current Requirements

GCT and GTO have similar turn-on and on-state gate current requirements. The gate driver provides a turn-on pulse with high dI/dt and peak current, and thereafter provides a steady state DC on-state sustaining current. The gate driver sometimes receives negative gate voltage during on-state of the GCT/GTO.

A new situation, unlike in the case of the GTO, is introduced for driving the GCT. The gate driver for the GCT has its feature in the amount of turn-on peak current and its shape. The turn-on current increase (dI/dt) for a GCT is 10 times to 50 times higher than that of typical GTOs, and trigger peak currents also are selected 5 to 10 times higher in order to reduce turn-on loss. A 6 inch GCT thus may require dI/dt=500A/us and a peak current of 300A.

While such a sharp high pulse safely turns on the GCT accompanying a high rate of rise of anode current, a long pulse duration must be provided after the sharp high pulse to maintain the GCT in on-state, if GCT operation accompanies a small rate of rise of anode current. Thereafter, on-state gate current similar to the GTO's (approximately 10A for a 4 inch or 6 inch device) is to be applied.

If no protection circuit, such as a current limiter, is provided, the gate driver may be damaged when the GCT's or GTO's load current changes its flow direction from a forward direction to a reverse direction. When the load current flows in the reverse direction, the load current will flow through a freewheel diode provided in parallel to the GCT. Thus, the GCT's anode turns negative with respect to its cathode. A parasitic diode in the GCT allows a negative potential to appear at the gate of the GCT.

Thereafter when the load current changes its flow direction again from the reverse direction to the forward direction, the load current may flow again through the GCT. Then, a safe GCT on-condition has to be established again.

Basically such requirements also are well known from GTO operation. GCT circuits are designed for higher switching frequency, and, as a consequence, freewheel diodes must respond to a considerably higher forward voltage drop, resulting in GCT gate voltage as low as −5V during normal converter operation.

Prior Art Circuits

The peak current is created from a voltage source by a resistor and capacitor circuit. In order to produce a high shooting pulse with a steep and rapid rising (dI/dt=500A/us), and a relatively long down slope pulse (10 us to 40 us) after the shooting pulse, requires several RC combinations with complicated adjustments. In such a design the total loss may exceed 50W for a 6 inch GCT drive.

A German Patent Laid-open publication No. DE3709150 and a PCT International Publication No. WO9407309 disclose the GTO driver using switched current sources. Inductors are fed to create the sources, and excessive energy is fed back to the power supply.

Basically in such way, very low loss can be achieved. But four high current switching devices and three diodes are required for generating a turn-on pulse and an on-state current. And the high turn-off peak current has to pass through a series connection of a switching element and an additional diode. Such a circuit cannot be used for a gate driver of GCT.

U.S. Pat. No. 4,791,350 discloses a gate driver which uses a switch-mode step down current regulator as a source for the GTO's steady state gate current. The regulator incorporates a switch and a freewheel diode, it's output is directly coupled to the GTO's gate, and a high current pulse is generated by a separate circuit having a switch and a resistor.

In this way, U.S. Pat. No. 4,791,350 suggests reducing gate driver losses. But if a negative GCT gate voltage should appear, the regulator's output current will increase without control. Moreover considerable losses are generated in the regulator's freewheel diode, when gate currents exceeding 5A are required. Also, high losses will result from the high current pulse resistor.

Japanese Patent laid-open publication No. H3-97315 and EP Patent publication No. 0 416 933 discloses a circuit to solve the problem with negative gate potential. The freewheel diode is connected to the negative supply line. The inductor is charged by the positive supply source. Upon freewheel, the charge in the inductor will be discharged to the negative supply. In this way the circuit can operate stably under all positive and negative GTO gate voltage conditions.

Such circuit is applicable for the generation of a small gate current. With high gate current, however, a lot of energy is transferred from the positive supply source to the negative supply source, and it must be transferred back to the positive supply by an appropriate power returning circuit. In the case of GCT, for example, a gate current Ig may be about 10A and a gate voltage Vg is about −20V. Then, a circulating power would be approximately 200W. In contrast to this, the active gate power according to this reference may be as small as Vg×Ig 0.6V×10A=6W. As a result, a tremendous over design of gate current generator and power supply is required, and a loss (approximately 20W–40W) is generated even with high-performance switch-mode circuits.

EP Patent publication 893883 discloses a gate driver which handles the GCT's freewheel situation in another way. A bipolar transistor, implemented as emitter follower, is to limit the GCT's gate current at negative gate voltage. The current is generated from voltage pulses with high efficiency.

For gate current Ig up to 2A, a circuit can be designed with appropriate components. At a higher gate current, the bipolar transistor gain will decrease below 20. Then, high base current is required, and loss will increase due to higher VCEsat (saturation of voltage Vce). At Ig=10A, Ib greater than 0.5A will be required, and VCEsat will amount to approximately 1V with the known PNP transistors.

Moreover, a high base current must be maintained with a GCT gate voltage being maintained not lower than 0.4V. Then, for higher GCT gate voltage and for open circuit condition (no GCT installed), a severe trade-off must be handled, complicating design and limiting the performance of the gate driver.

SUMMARY OF THE INVENTION

A circuit must be found which is appropriate to realize high current GCT drive. It has to generate a sharp, high trigger current pulse for GCT turn-on, a long trigger current tail and high gate current with low loss, and it has to be safe under all gate voltage operating conditions.

Moreover the circuit has to be such that it can be realized mainly with SMD components and technology in order to allow very compact and cost effective solutions.

One aspect of the invention includes a gate driver for driving a thyristor having an anode, a cathode, and a gate by providing a gate current to the gate of the thyristor during an on-command signal, the gate driver comprising:

a turn-on pulse generator for generating a turn-on pulse in response to a leading edge of the on-command signal;

a down converter for producing a down slope current immediately following the firing pulse; and a current limiter having a MOSFET connected to the gate of the thyristor for supplying current from the down converter to the gate of the thyristor, the current limiter monitoring the gate voltage at the gate of the thyristor and increasing an internal resistance of the MOSFET relative to the negative voltage increase of the gate voltage.

According to the invention, the down converter comprises:

a pattern generator for generating a pattern of a current to be produced from the down converter;

a conduction pulse generator for generating conduction pulses in accordance with the pattern;

a switching element for conducting a current from a power source in response to the conduction pulses and producing a pulse current; and an inductor for smoothing the pulse current;

the pattern generator generating a pattern having a rising edge and down slope portion after the rising edge, so that the down slope current produced from the down converter decreases relative to the pattern.

In a gate driver, the down converter further comprises:

another conduction pulse generator for generating other conduction pulses in accordance with the pattern;

another switching element for conducting a current from the power source in response to the other conduction pulses and producing another pulse current; and another inductor for smoothing the other another pulse current so that the down slope current is increased.

In a gate driver, the down converter further comprises:

an additional inductor in parallel with the inductor; and an additional switching element in series with the additional inductor to produce a greater down slope current.

In a gate driver, the down converter further comprises:

an additional inductor in parallel with the inductor; and a saturating reactor element in series with the additional inductor to produce a greater down slope current.

In a gate driver, the current limiter comprises:

a comparator for comparing an output voltage at the output of the down converter with a predetermined voltage and producing an adjust signal relative to a difference between the output voltage and the predetermined voltage when the output voltage falls below the predetermined voltage, and the MOSFET receiving the adjust signal to change its internal resistance relative to the adjust signal.

A gate driver according to the invention has as the comparator an operational amplifier.

In a gate driver, the comparator comprises bipolar transistors.

A gate driver according to the invention includes in the current limiter a freewheel diode connected parallel to the MOSFET.

In the gate driver, the turn-on pulse generator comprises a capacitor, a diode connected parallel to the capacitor, a switching element, and a reactor to produce a sharp high pulse.

The gate driver may comprise a bias current generator to provide a low level bias current to the gate of the thyristor.

A gate driver according to the invention is a GCT.

DETAILED DESCRIPTION OF THE PREFERRED EMBODIMENTS

Figure 1:
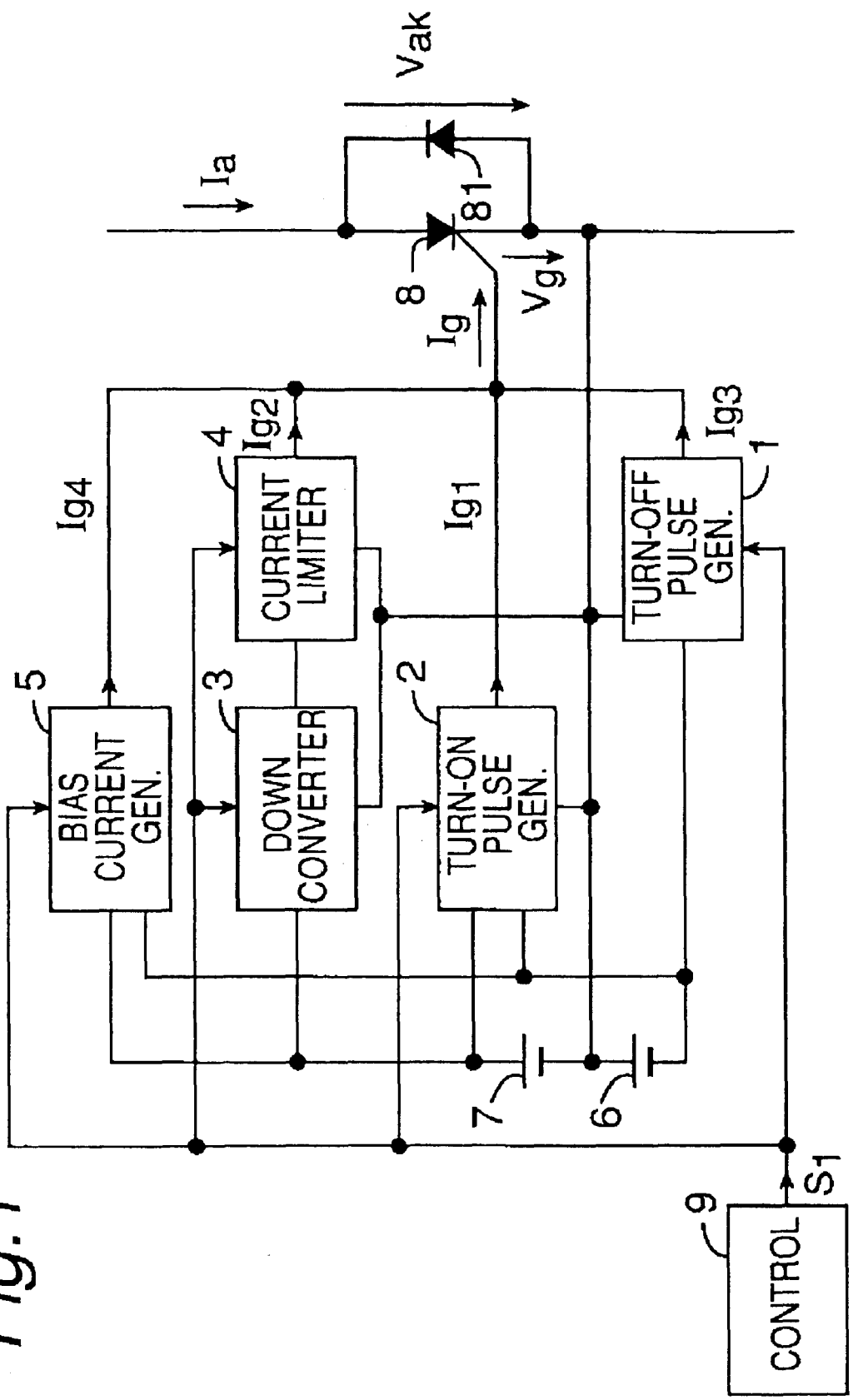
FIG. 1 is a block diagram of a gate driver for a thyristor.

Referring to FIG. 1, a block diagram of a gate driver according to the present invention is shown for driving a large capacity switching element 8 into ON and OFF conditions. The gate driver of the present invention can be applied to various types of switching element 8, for example, a GCT (gate commutated turn-off) thyristor, a GTO (gate turn-off) thyristor, a static inductive thyristor (SITH), or a power transistor. The present invention is, however, particularly suitable for use with a GCT thyristor. Thyristor 8 has an anode, a cathode and a gate. Thyristor 8 is connected in parallel with a diode 81 in reverse direction such that anode and cathode of thyristor 8 are respectively connected to cathode and anode of diode 81. Thyristor 8 is further connected with a load (not shown) in series.

In FIG. 1, a reference number 1 is a turn-off pulse generator for generating a turn-off pulse Ig3, 2 is a turn-on pulse generator for producing a turn-on pulse or firing pulse Ig1, 3 is a down converter, 4 is a current limiter, 5 is a bias current generator for generating a bias current Ig4 and 9 is a controller for producing an on-command signal S1. Current limiter 4 operates in association with down converter 3 and produces a sustaining current Ig2. The currents Ig1, Ig2, Ig3 and Ig4 are added together to form a gate current Ig.

Figure 2:
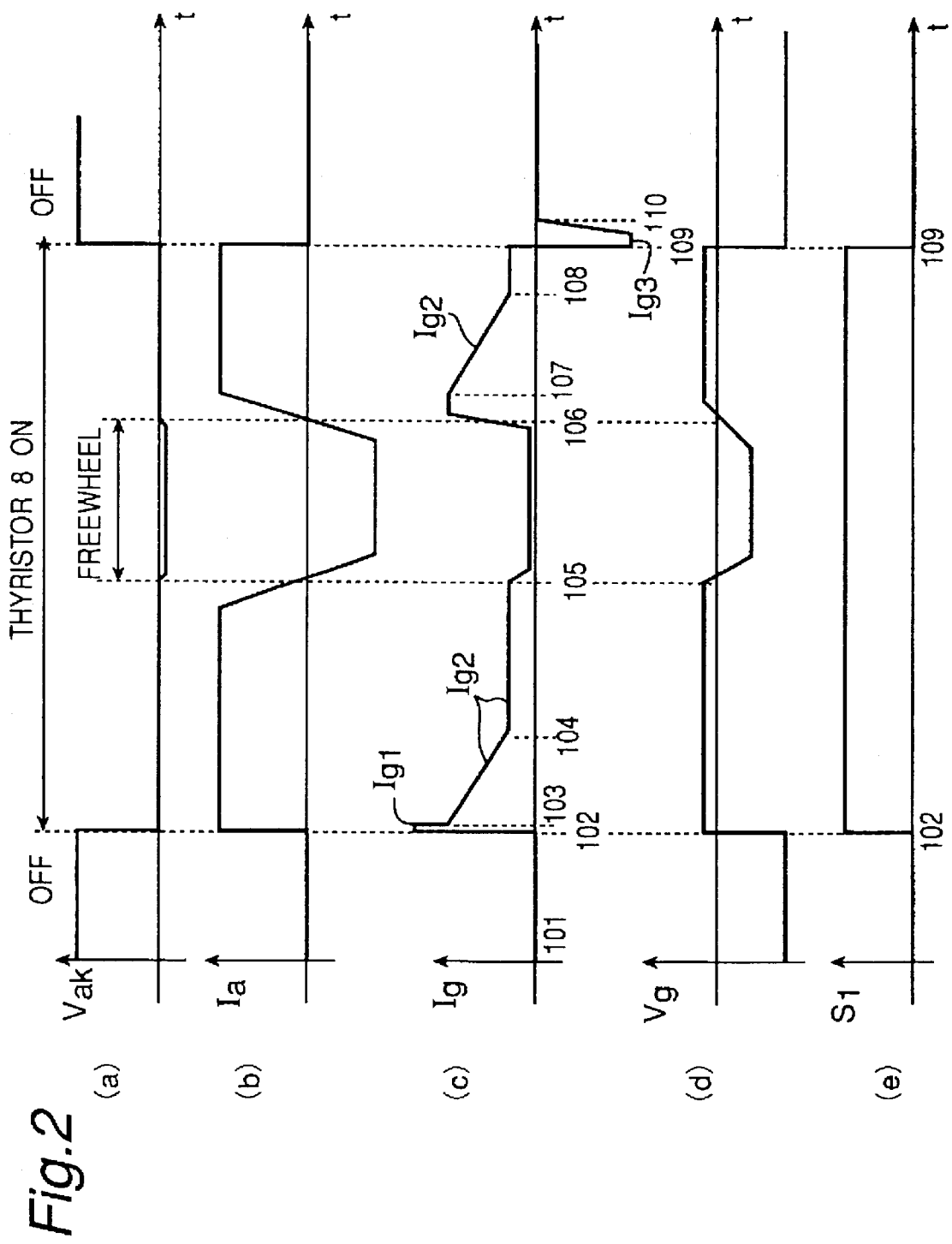
FIGS. 2(a)–2(e) show waveforms observed at major points in the block diagram of FIG. 1.

FIG. 2 shows waveforms observed at major points in the circuit of gate driver of FIG. 1. Particularly, FIG. 2(a) shows a voltage Vak across thyristor 8 between anode and cathode, FIG. 2(b) shows an anode current Ia through thyristor 8, FIG. 2(c) shows a gate current Ig to the gate of thyristor 8, FIG. 2(d) shows a gate voltage Vg at the gate of thyristor 8 and FIG. 2(e) shows an on-command-signal S1 produced from controller 9.

As shown in FIG. 2(e) the controller 9 produces a high level on-command-signal S1 in a period 102–109 for activating the gate driver so as to turn on the thyristor 8 in said period 102–109.

As shown in FIG. 2(c), in response to the leading edge or rising edge of the on-command-signal S1 at time 102, the turn-on pulse generator 2 is activated to produce an instantaneous high level current (a firing pulse) Ig1 in a period 102–103 which is, e.g., 5–30 microseconds. A peak current value of the firing pulse Ig1 is e.g., several hundreds to 1000 amperes. The firing pulse Ig1 is applied to the gate of the thyristor 8 at a very beginning of the gate current Ig to turn on the thyristor 8.

Also, as shown in FIG. 2(c), in response to the leading edge of the on-command-signal S1, the down converter 3 produces a down slope current Ig2 as a leading portion of the sustaining current Ig2. The down slope current Ig2 is produced in a period 102–104 which is e.g., 10–100 microseconds. The down slope current has a rising edge at time 102 and a down slope portion in a period 102–104. The rising edge is overlapped within the firing pulse. It is possible, however, that the down slope current has its rising edge at time 103. In this case, the down slope portion exists in time 103–104. The down slope current is provided to ensure that the thyristor 8 maintains its on state even after the firing pulse (time 102–103) disappears.

In response to the leading edge of the on-command-signal S1, the bias current generator 5 produces a bias current Ig4, which is e.g., several hundreds milliamperes during a period 102–109. In FIG. 2(c), the bias current Ig4 is not shown, because it is very small compared to sustaining current Ig2.

As shown in FIG. 2(b), when the anode current Ia suddenly falls to a negative value at time 105 due to some sudden change in the load connected to the thyristor 8, a reverse anode current Ia flows through diode 81, and at the same time the gate voltage Vg falls below zero. The current limiter 4 is provided to control the gate current Ig applied to the gate of the thyristor 8 to stay in the forward bias current even when the gate voltage Vg falls below zero.

Each of the circuits 1–5 will be described in detail below.

Figure 3:
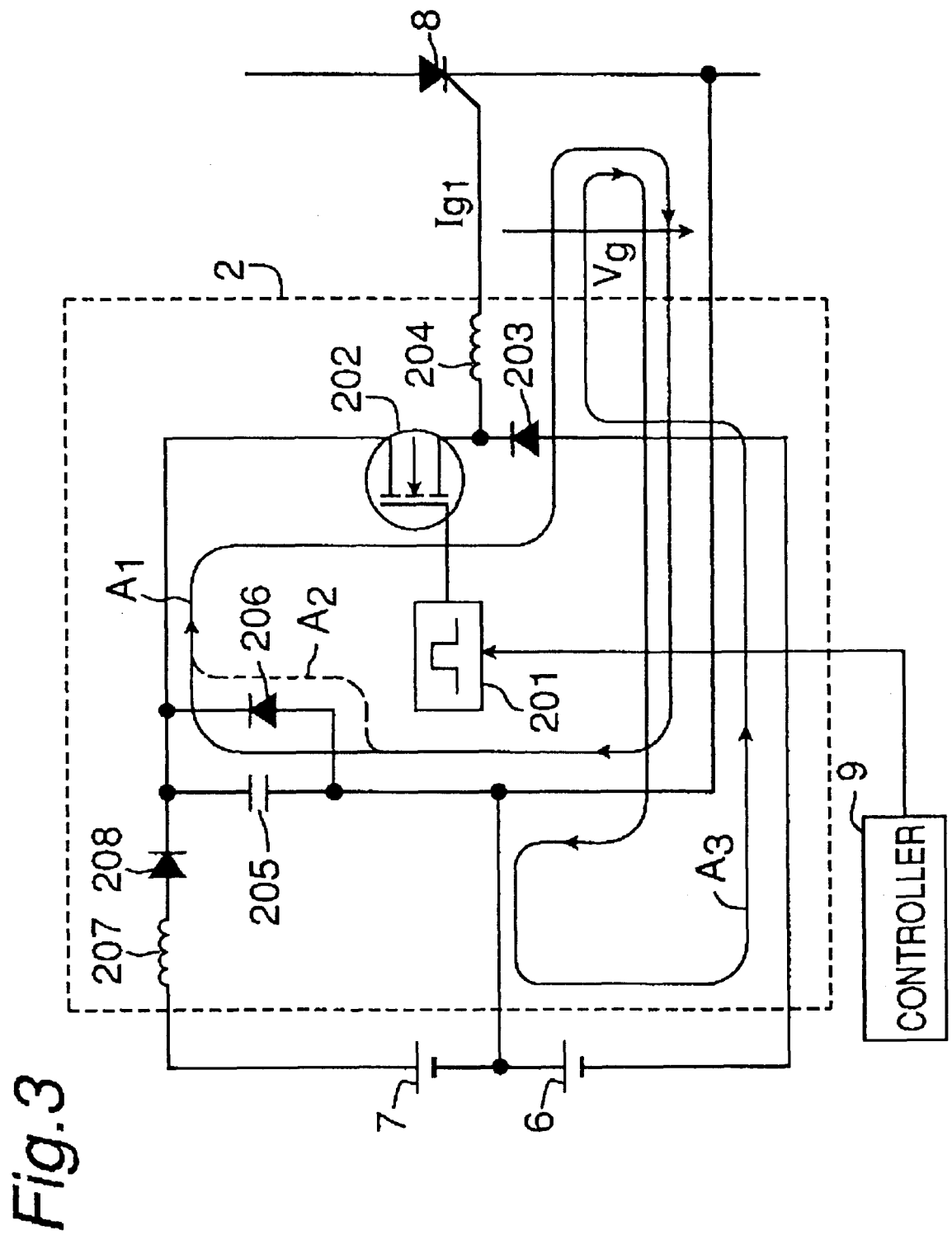
FIG. 3 is a circuit diagram of a turn-on pulse generator shown in FIG. 1.

Referring to FIG. 3, turn-on pulse generator 2 is shown. The turn-on pulse generator 2 comprises a trigger pulse generator 201, a switching transistor 202, a freewheel diode 203, a pulse forming reactor 204, a pulse capacitor 205, a capacitor freewheel diode 206, a reactor 207 and a diode 208.

Operation of the turn-on pulse generator 2 is as follows.

First, capacitor 205 is charged to a preset voltage 2Vb by a charging circuit from a power source 7 having a voltage Vb, through reactor 207 and diode 208. At time 102, in response to the leading edge of the on-command-signal S1 from controller 9, the trigger pulse generator 201, having a pulse generator, such as a data flip-flop, produces a trigger pulse having a predetermined pulse width. The trigger pulse is applied to transistor 202. Thus, at time 102, transistor 202 turns on. Then, capacitor 205 is connected to reactor 204, and a gate pulse current Ig1 starts to flow into the gate of the thyristor 8. As the gate pulse current Ig1 increases, voltage of capacitor 205 will decrease. When the voltage of capacitor 205 reaches zero, the gate pulse current reaches a maximum level. Therefore, capacitor 205 and reactor 204 are selected to perform a resonant operation such that starting dI/dt and peak current of the gate pulse current satisfy the requirements of the thyristor 8. Thus, during the discharge of capacitor 205, the gate pulse current Ig1 flows along a line A1 shown in FIG. 3

When the voltage across the capacitor 5 turns negative, then diode 206 will conduct to allow a by-pass current A2 shown by a dotted line, and the resonant operation stops. As a consequence, using the by-pass current A2, the current in reactor 204 is kept at the high level. Then, the current A1 decreases slowly due to the voltage at the gate of thyristor 8, and also due to the losses in the reactor 204, switching transistor 202 and diode 206.

After a predetermined time, trigger pulse generator 201 terminates to generate the trigger pulse, thus, turning off switching transistor 202. Then the reactor current commutate along line A3, so that the energy stored in reactor 204 is released through the freewheel diode 203 into a negative supply.

An operation under the presence of a negative gate bias voltage is very similar to the above operation.

Upon triggering of transistor 202 by the trigger pulse generator 201, the capacitor 205 discharges, and reactor 204 cumulates energy. Then freewheel diode 206 conducts after the capacitor 205 is discharged to zero volts. Depending on the amount of negative gate bias voltage, the gate current will decrease slowly or increase with time. At time 103 transistor 202 is turned off, and the energy in reactor 204 is released into power supply 6.

With small negative bias voltage, safe operation of the circuit can be achieved. If high negative bias voltage must be handled like in a case of a fast high voltage GCT freewheel diode, then the gate current may reach excessively high current even within the short period of time (102–103). In such a case, the gate drive voltage to transistor 202 and its characteristics is selected to limit such current. As a consequence, safe operation is achieved even under high negative bias voltage.

Figure 4:
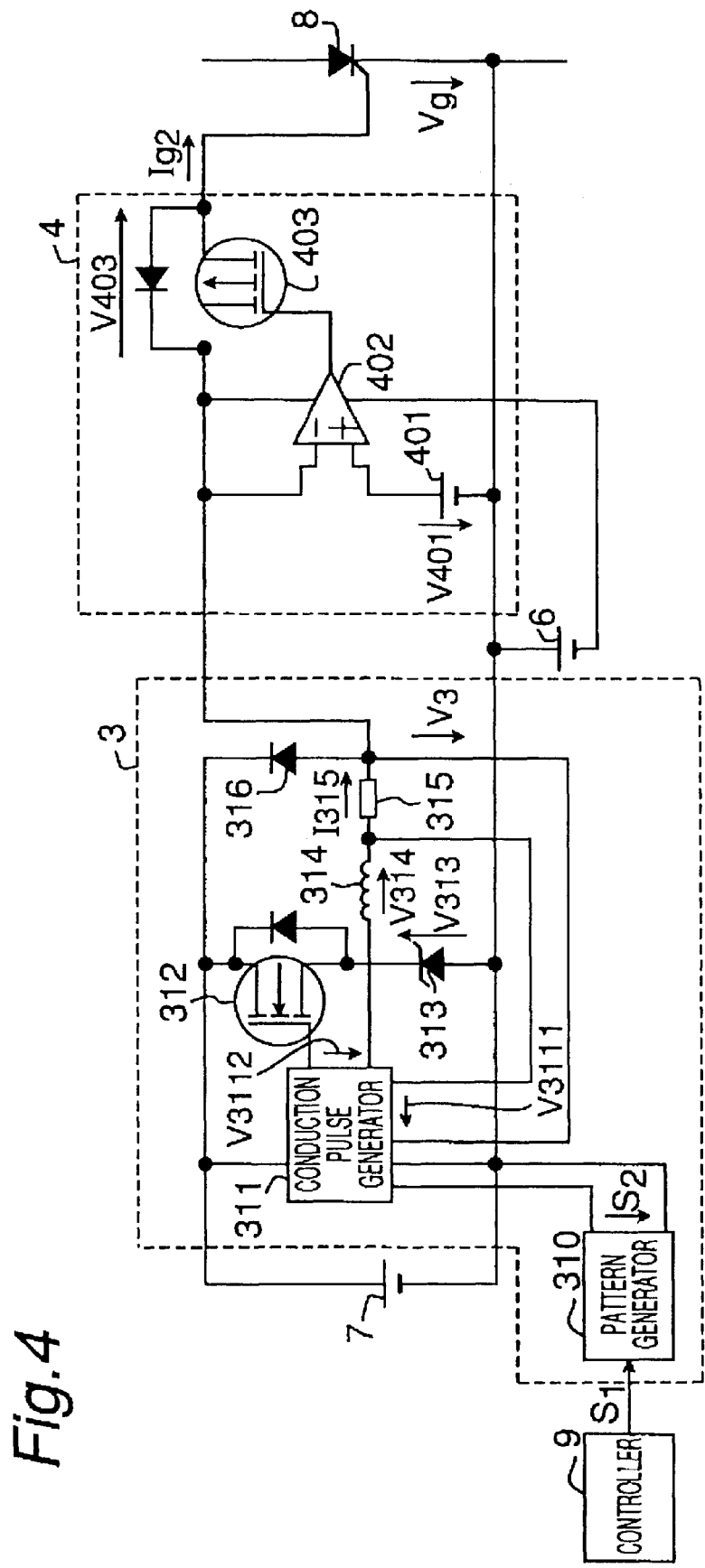
FIG. 4 is a circuit diagram of a down converter and current limiter shown in FIG. 1.

Referring to FIG. 4, down converter 3 and current limiter 4 are shown. First, the down converter 3 is described.

Down converter 3 has a pattern generator 310, a conduction pulse generator 311, an FET 312, a low loss Schottky diode 313, an inductor 314 a current sense resistor 315, and a diode 316. Conduction pulse generator 311, FET 312, low loss Schottky diode 313, inductor 314 and current sense resistor 315 are connected to form a low loss step down converter.

Figure 5:
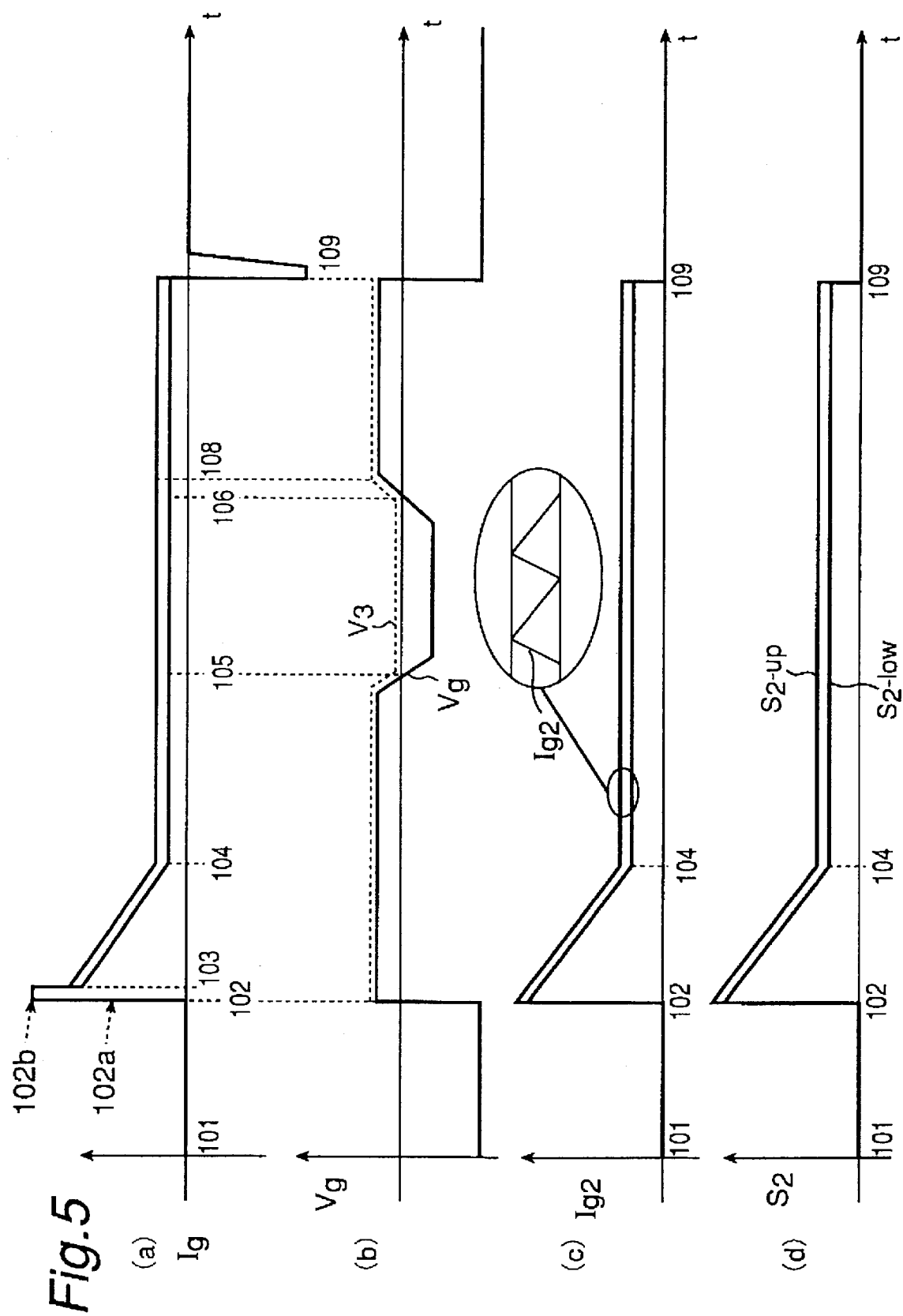
FIGS. 5(a)–5(d) show waveforms observed at major points in the circuit of FIG. 4.

In response to the on-command signal from controller 9, pattern generator generates a pattern signal S2, and produces an up limit signal S2-up and a low limit signal S2-low, as shown in FIG. 5(d). The pattern signal S2 has a rising edge at time 102, a down slope portion during time 102–104 and a constant level during time 104–109. The up limit signal S2-up and low limit signal S2-low are applied to conduction pulse generator 311 which generates a conduction pulse shown in FIG. 6(a) in a manner described below.

Conduction pulse generator 311 detects a current flowing through resistor 315, and compares the current level with the up limit signal S2-up and low limit signal S2-low. When current I315 falls below the low limit signal S2-low, the conduction pulse generator 311 produces a conduction pulse (FIG. 6(a)) to drive FET 312 into conducting state. In this way the current from source 7 is applied through a series connection of inductor 314, resistor 315, FET 403 and to the gate of the thyristor 8. The current conducted through FET 403 is a pulse current, but is smoothed after inductor 314. As a consequence, induction voltage V314 is set positive, and current I315 increases with a rate of rise given by V314 and the inductance of inductor 314.

Figure 6:
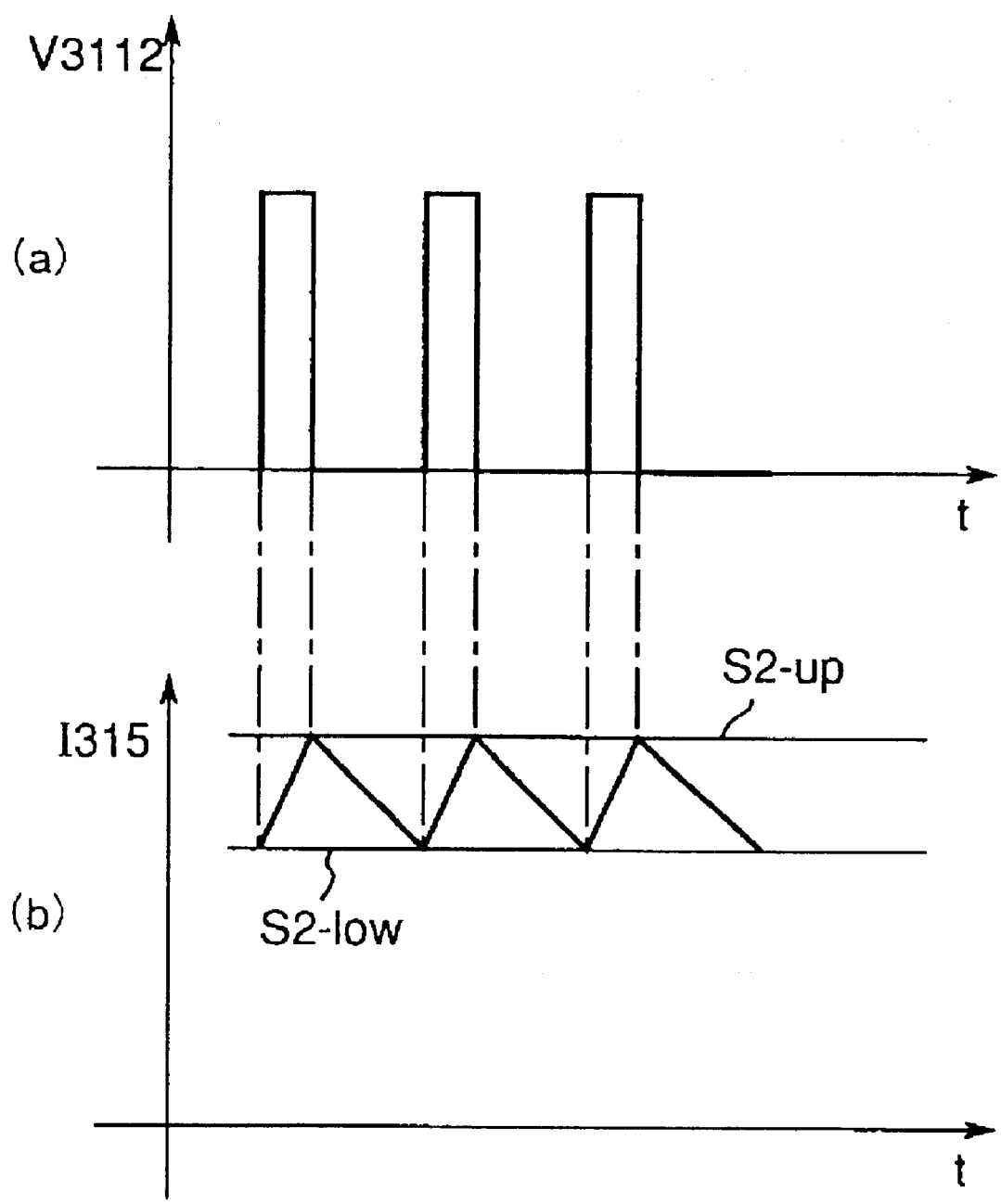
FIGS. 6(a) and 6(b) show waveforms observed in the down converter of FIG. 4.

Thereafter, as shown in FIG. 6(b), when current I315 increases to the up limit signal S2-up, the conduction pulse generator 311 terminates the conduction pulse so as to switch FET 312 into blocking state. The current I315 commutates to diode 313. The voltage V314 is reversed and can be expressed as follows:

$$V314=-(V3+V313+R315 \times I315)$$

wherein V3 is an output voltage of the down converter 3. Then, current I 315 decreases again towards the low limit signal S2-low.

The voltage of source 7 is selected considerably higher than Vg. In this way high rate of rise of current I315 (dI315/dt) is achieved at conduction of FET 312, and small dI315/dt results at conduction of diode 313, resulting in long conduction of diode 313 and short conduction of FET 312. As a consequence the average current drawn from source 7 is small compared to I315, and voltage 7 can be generated with standard low power components.

Diode 313 and FET 403 are selected for low on-state resistance (RDSon). In this way V313 and V403 become smaller than Vg, and with similar selection of resistor 315, a total efficiency in the order of 50% is achieved even at Vg=0.6V and I315=10A. Thus, a current produced from the down converter 3 decreases immediately after the firing pulse but gradually.

Inductor 314 is selected for high saturation current. Then, due to the characteristics of the FETs and the diode, a high level current can be generated and supplied to the gate of the thyristor 8 for a period of time 103–104. To achieve this, the pattern generator 310 increases the up and low limit signals S2-up and S2-low. In this way the long slope pulse (time 103–104) also is generated with high efficiency. The long slope pulse is explained as produced during time 103–104, but can be produced during time 102–104, partly overlapping with the firing pulse (time 102–103).

Still referring to FIG. 4, the current limiter 4 is described next.

Current limiter 4 has a constant voltage source 401, a comparator 402 formed by an operational amplifier, and a p-channel FET 403. When a gate voltage Vg is pulled negative by a negative anode voltage (time 105–106), the output voltage V3 of down converter 3 also decreases. Comparator 402 detects the gate voltage Vg by comparing the down converter's output voltage V3 with a predetermined constant voltage V401. When the gate voltage Vg decreases to and below the constant voltage V401, comparator 402 produces an adjust signal having a level proportional to the decreased level of down converter output voltage below the constant voltage V401. The adjust signal is applied to the gate of FET 403, which thereupon starts to increase the internal resistance, resulting such that the voltage drop across the FET 403 increases. Thus, the voltage of the output side (the side connected to the gate of the thyristor 8) of the FET is reduced and the input side thereof is maintained nearly the same. Thus, the voltage drop observed at the gate of thyristor 8 is mainly absorbed in the voltage drop effected across FET 403, so that the voltage V3 applied to the input side of the FET 403 will be maintained in the positive region, as shown in FIG. 5(b) even when the gate voltage Vg falls below zero. Thus, the low loss step down converter will continue to operate with normal operating conditions.

As apparent from the above, the current limiter 4 monitors the gate voltage Vg at the gate of thyristor 8 and maintains the forward bias current to the gate of the thyristor 8 even when the gate voltage falls less than zero volt. By limiter 4, the thyristor 8 can be maintained in the on-state even when a sudden current drop appears in the anode current Ia. Also, by limiter 4, the gate current Ig can be maintained in the forward bias current, eventually protecting various circuits in the gate driver, particularly the circuit in the down converter from receiving a reverse bias current.

It is to be noted that down slope current may be produced immediately after the comparator 402 stops generating the high level signal, i.e., at time 106 when the gate voltage Vg changes from the negative to positive. For this purpose, an output of comparator 402 can be also applied to the pattern generator 310.

Negative gate voltage as low as −5V like in the case of a fast freewheel diode will produce high loss in the limiter. Then, by an additional connection to the gate voltage, pattern generator 310 may be activated to reduce pattern signal S2 during such time. As shown in FIG. 2(c), this will result in reduced gate current inside the interval between 105 and 106 and considerable reduction of loss in MOSFET 403.

Setting such a low current by down converter 3 requires very high precision in the sense amplifier of conduction pulse generator 311. Therefore a bias generator is included in the gate drive circuit. Then, output current of down converter 3 is set to zero by pattern generator 310 at a pre-set low gate voltage, e.g. at −2V, and gate bias current is maintained by the bias generator.

Figure 7:
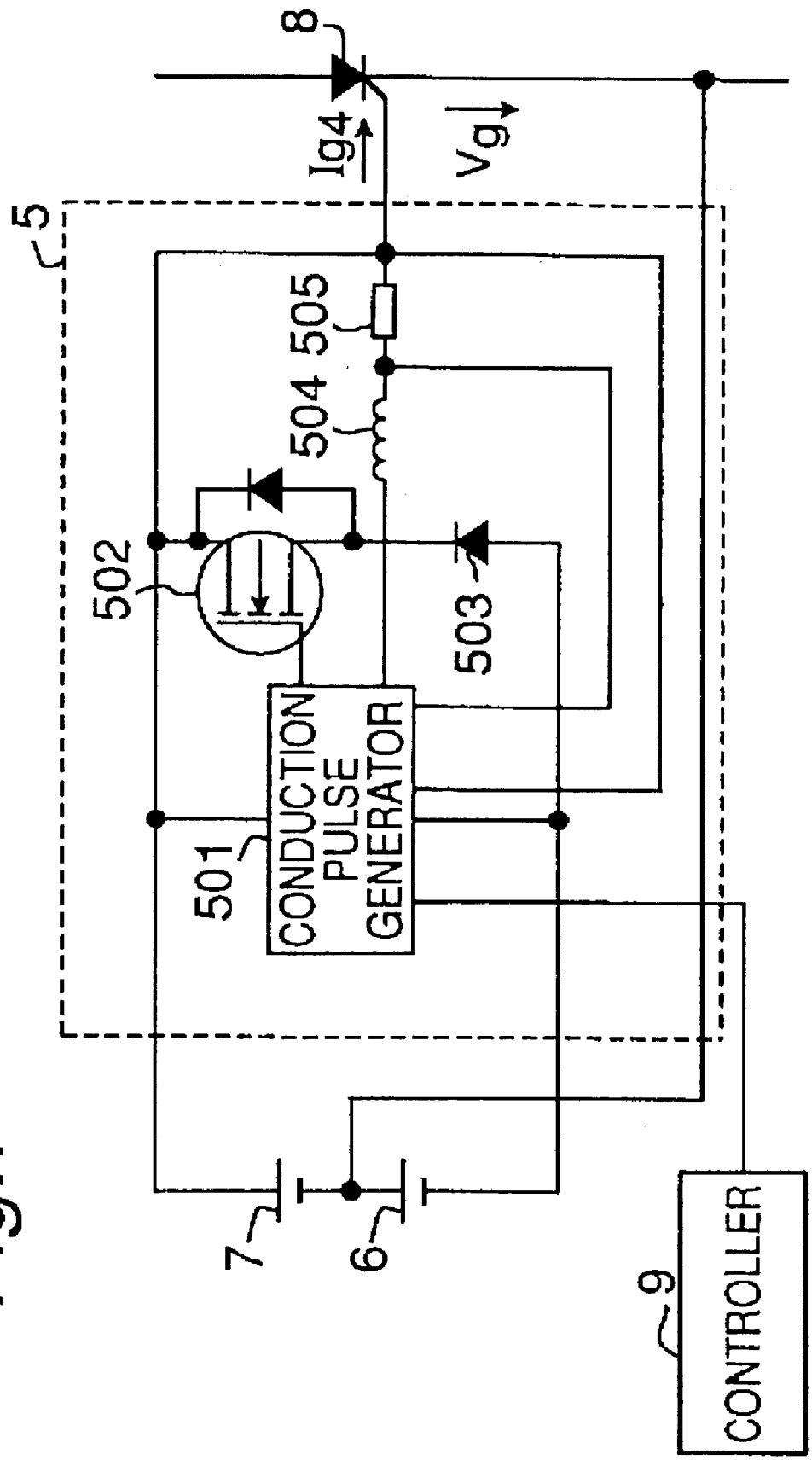
FIG. 7 is a circuit diagram of a bias current generator shown in FIG. 1.

Referring to FIG. 7, a bias current generator 5 is shown. The bias current generator 5 has a pulse generator 501, a switching transistor 502, a diode 503, a reactor 504 and a resistor 505. The pulse generator 501 produces a pulse at time 102 in response to the leading edge or rising edge of on-command signal S1 produced from the controller 9. Thus, in response to the pulse from the pulse generator 501, switching transistor 502 turns on to produce a positive going pulse which is applied through reactor 504 and resistor 505 to the gate of thyristor 8. The freewheel diode 503 is connected to the negative potential of source 6. As a consequence the bias current generator will maintain normal operation also at gate voltage as low as the output of source 6.

Modification 1

Figure 8:
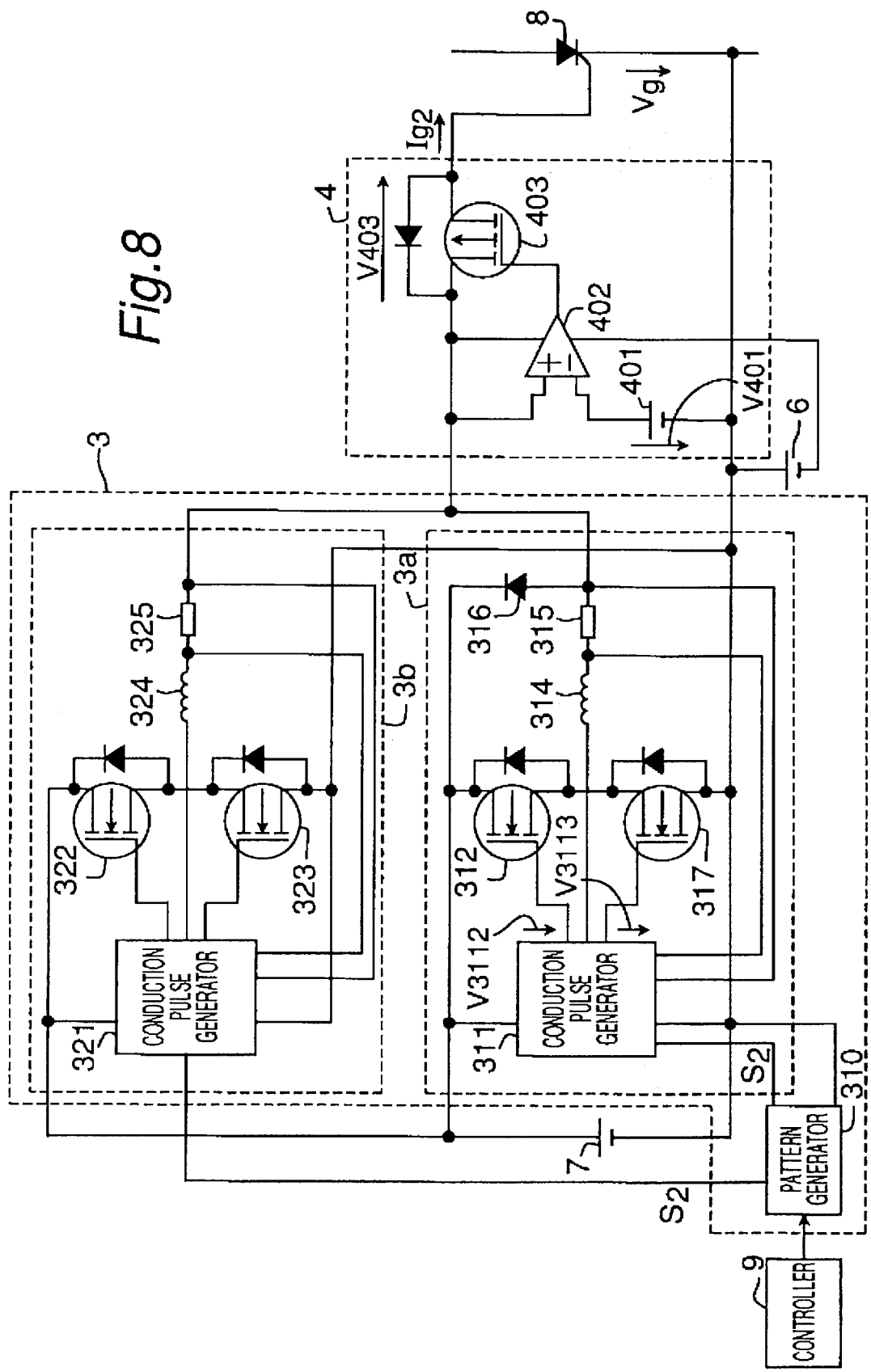
FIG. 8 is a circuit diagram according to the first modification.

Referring to FIG. 8, a first modification is shown. The down converter 3 is modified. The down converter 3 has a pattern generator 310, a first converter 3a and a second converter 3b. The first converter 3a has a conduction pulse generator 311, FETs 312 and 317, an inductor 314, a resistor 315, and a diode 316. Similarly, the second converter 3b has a conduction pulse generator 321, FETs 322 and 323, an inductor 324 and a resistor 325.

The pattern generator 310 produces up limit signal S2-up and a low limit signal S2-down in a manner similar to that described above.

It is noted that the inductor 324 has an inductance which is equal to a half of the inductance of the inductor 314. The conduction pulse generator 321 is operative only during the down slope period (time 102–104), and the conduction pulse generator 311 is operative during the entire on-period (time 102–109). Other than inductor, diode 316 and conduction pulse generator 321, the circuit elements in the first converter 3a are the same as those in the second converter 3b.

Thus, as shown in FIG. 9(a), the first converter 3a produces a current shown by a portion A, and the second converter 3b produces a current shown by a portion B. Since reactor 324 has a reactance (½)L and reactor 314 has a reactance L, the current in portion B is twice as great as the current in portion A. By the circuit of FIG. 8 a tripple high slope pulse (time 103–104) including current portions A and B can be produced with high efficiency.

Modification 2

Figure 10:
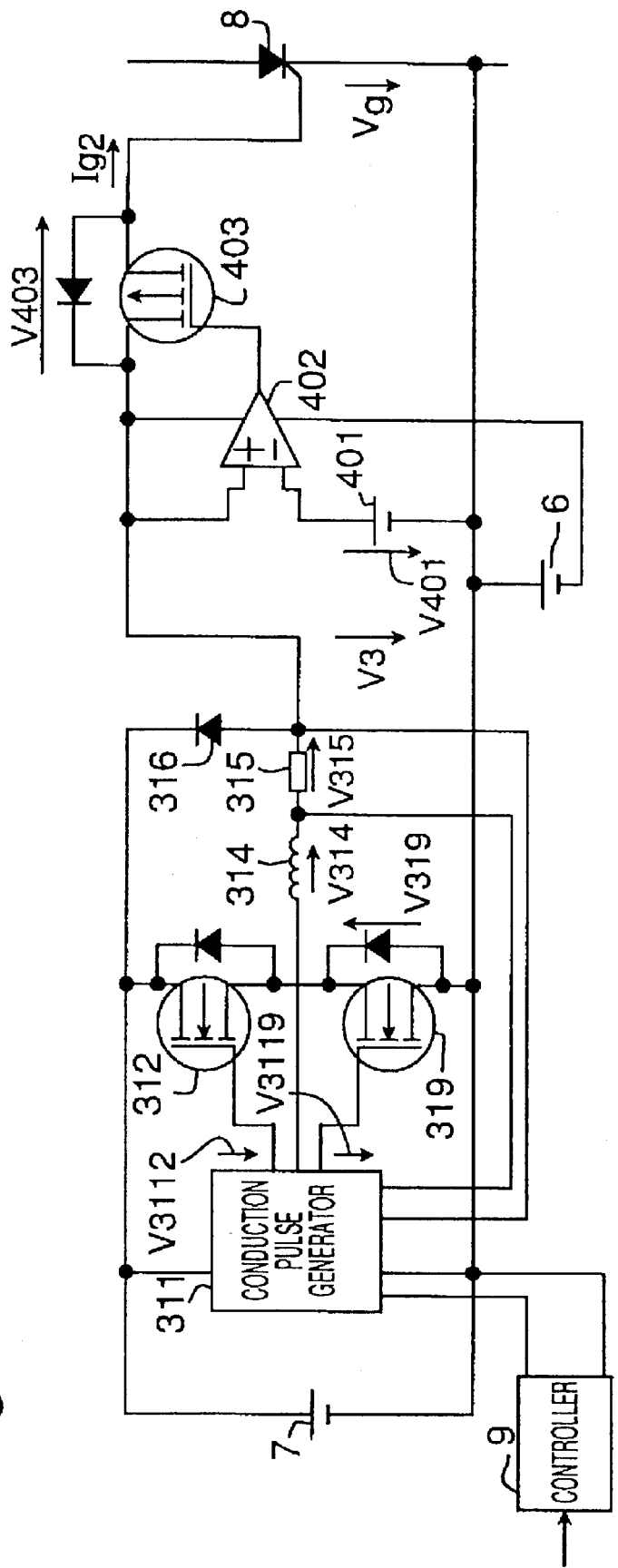
FIG. 10 is a circuit diagram according to the second modification.
Figure 11:
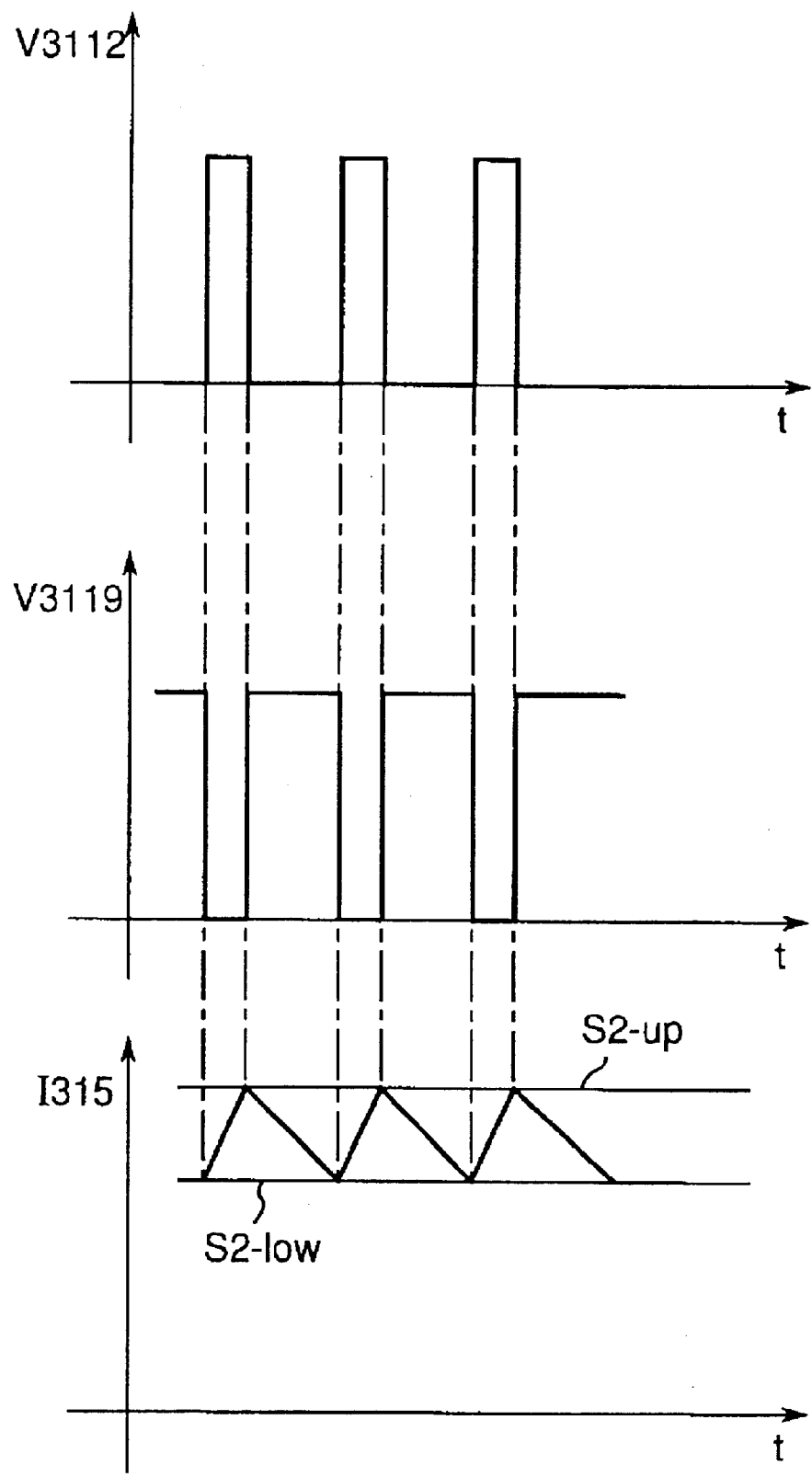
FIG. 11 is a waveforms observed in the circuit of FIG. 10.

Referring to FIG. 10, a second modification is shown. The down converter 3 is modified. When compared with the down converter 3 shown in FIG. 4, the down converter 3 shown in FIG. 10 has an FET transistor 319 in place of diode 313. Other arrangements are the same as those shown in FIG. 4. As shown in FIG. 11, a signal applied to the gate of FET 319 has a phase opposite to that of the signal applied to the gate of FET 312. In this modification, a synchronous rectifier (FETs 312 and 319) is implemented to generate long slope pulse current (time 103–104). Upon selection of low on-state (RDSon) for FET 319, voltage V319 obtained across the FET 319 is by far smaller than the voltage obtained across the diode 313 of FIG. 4 (V319<<V313). Thus, efficiency for obtaining long slope pulse clearly exceeding 50% is achieved.

Modification 3

Figure 12:
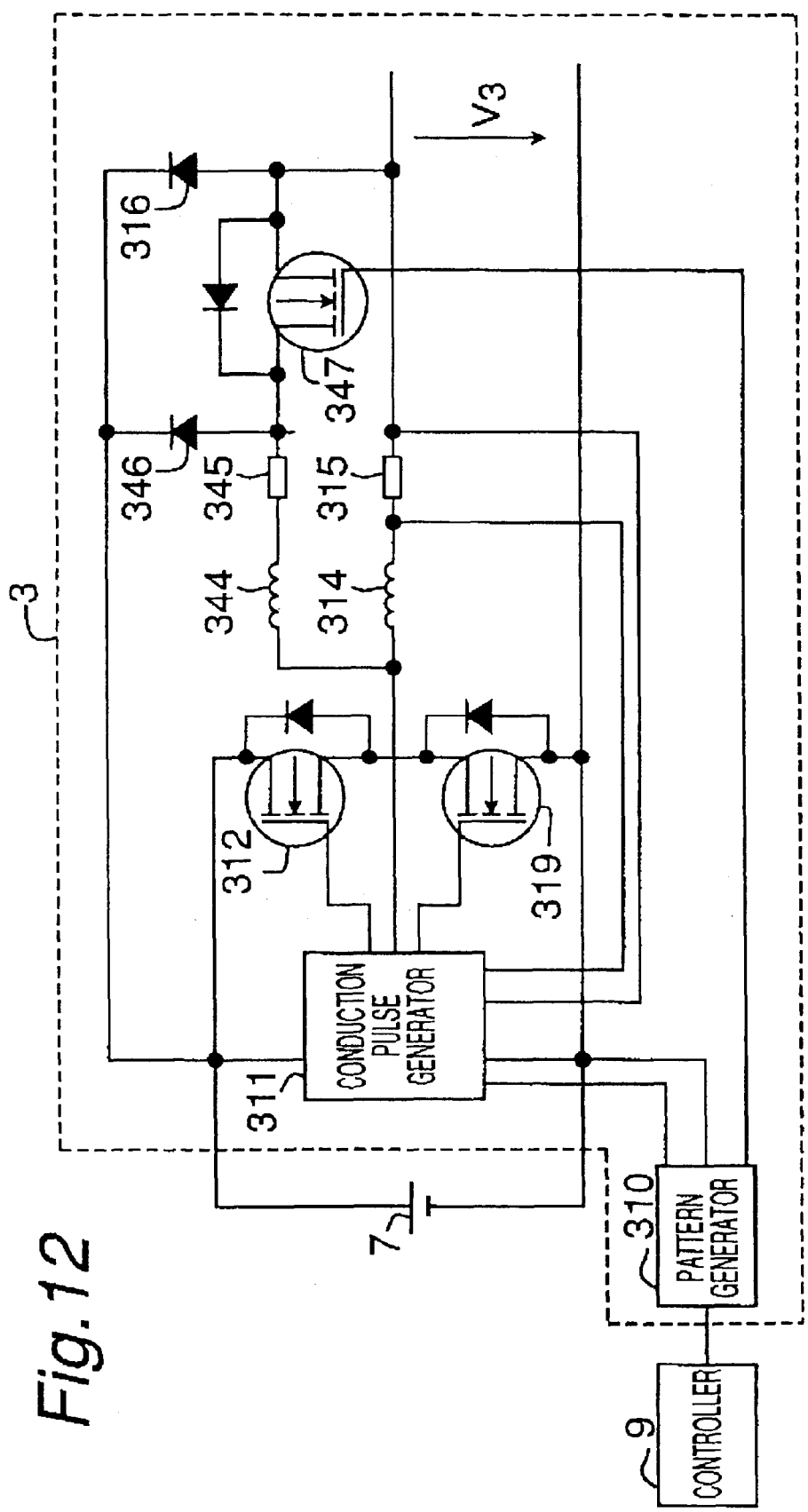
FIG. 12 is a circuit diagram according to the third modification.

Referring to FIG. 12, a third modification is shown. The down converter 3 is modified. When compared with the down converter shown in FIG. 10, the down converter shown in FIG. 12 further has a reactor 344, a resistor 345, a diode 346 and a FET 347. The gate of FET 347 is connected to the pattern generator 310. The FET 347 is controlled by a control pulse from the pattern generator 310 to conduct only during the slope period (time 102–104 or 103–104).

Figure 9:
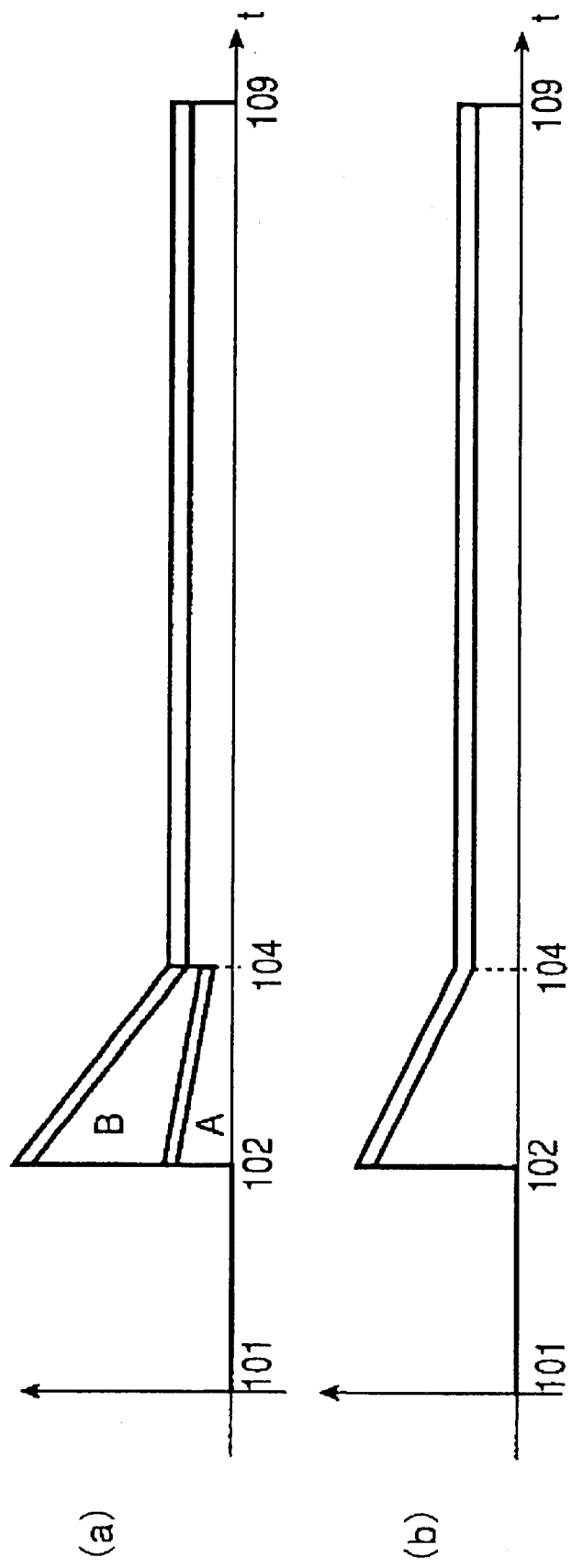
FIGS. 9(a) and 9(b) show waveforms observed in the circuit of FIG. 8.

In the modification shown in FIG. 12, only one synchronous rectifier circuit (311, 312, 319) is provided to generate a double long slope pulse (time 103–104) including current portions A and B shown in FIG. 9. The current portion B is generated by the circuit elements 344, 345, 346 and 347, and the rectifier circuit (311, 312, 319) is used in common for generating the portions A and B. Reactor 344 has a reactance (½)L and reactor 314 has a reactance L. The generation of the current portion B is explained below.

At time 103 FET 347 is conducted by pattern generator 310. Since a series connection of reactor 344 and resistor 345 is connected in parallel to a series connection of reactor 314 and sense resistor 315, additional current will flow through the series connection of reactor 344 and resistor 345. Thus, the down slope current increases.

At time 104 the down slope current reaches to the stable bias current. Thus, the pattern generator 310 terminates to produce the control pulse Then, FET 347 is turned off. Through diode 346 the energy stored in reactor 344 is released to the positive supply 7, and the stable bias current supply continues by reactor 314 and sense resistor 315.

Modification 4

Figure 13:
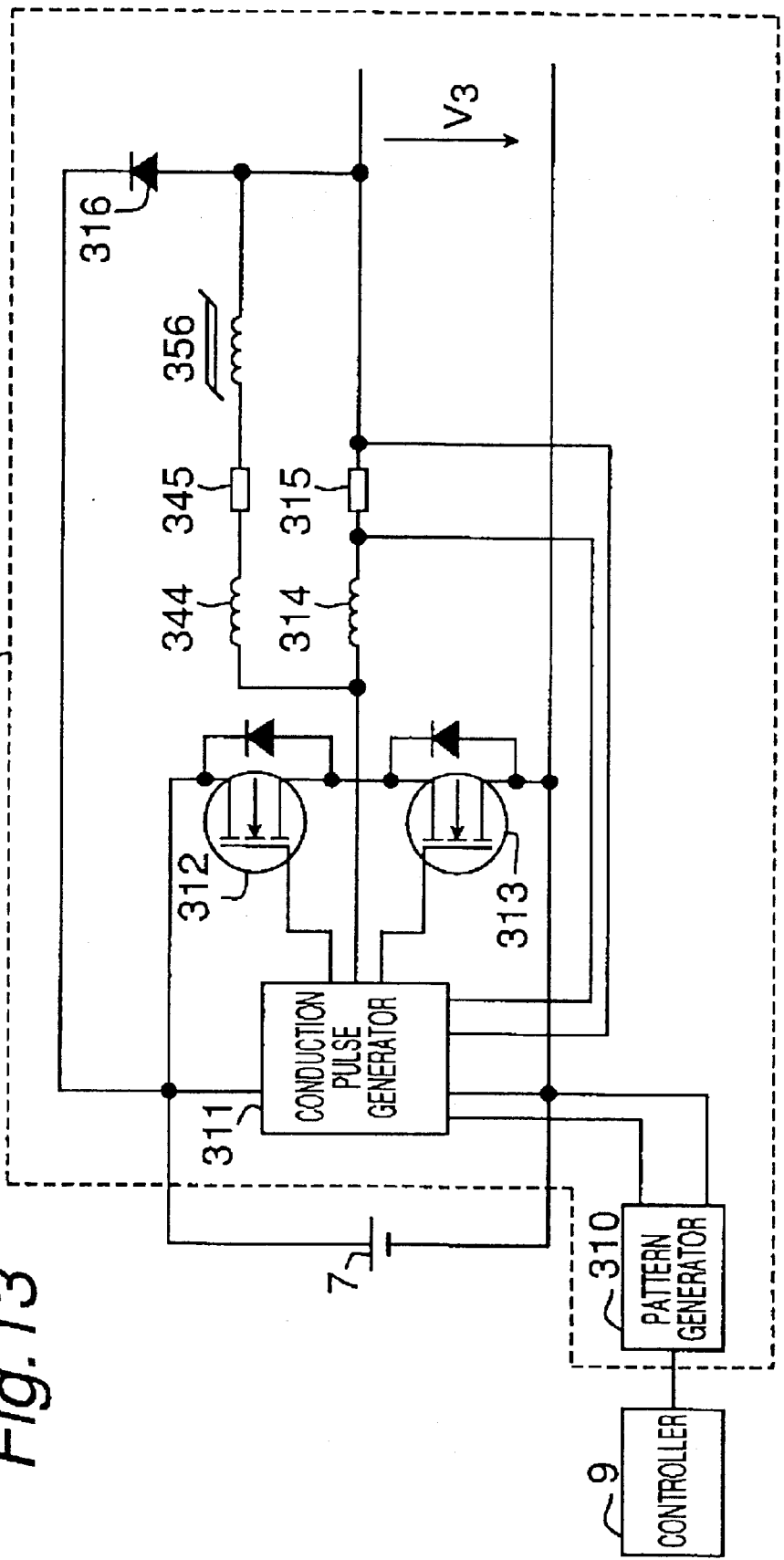
FIG. 13 is a circuit diagram according to the fourth modification.

Referring to FIG. 13, a fourth modification is shown. The down converter 3 is modified. The down converter shown in FIG. 13 is very similar to the down converter shown in FIG. 12. In place of FET 347 in FIG. 12, a saturating reactor 356 is provided. Also, the diode 346 is removed in FIG. 13. Other circuit elements are the same as those shown in FIG. 12. The operation is as follows.

At time 102 the pattern generator 310 produces a high pattern signal S2 so as to build up a high DC current through reactor 314 and reactor 344. Then reactor 356 saturates by the DC current through reactor 344. Reactor 356 has a feature to present a small saturation inductance value, so that the energy is mainly accumulated in reactors 344 and 314. As a consequence, a high amount of current is produced by elements 344, 345 and 356.

At time 104 the pattern generator 310 terminates to produce a high pattern signal. Reactor 356 is designed to go out of saturation under such condition. Then, reactor 356 has a feature to present a high inductance value, so a small amount of current flows through elements 344, 345 and 356. In such way low loss in the sense resistor 315 during generation of long slope pulse and high precision of Ig2 can be achieved.

Modification 5

Figure 14:
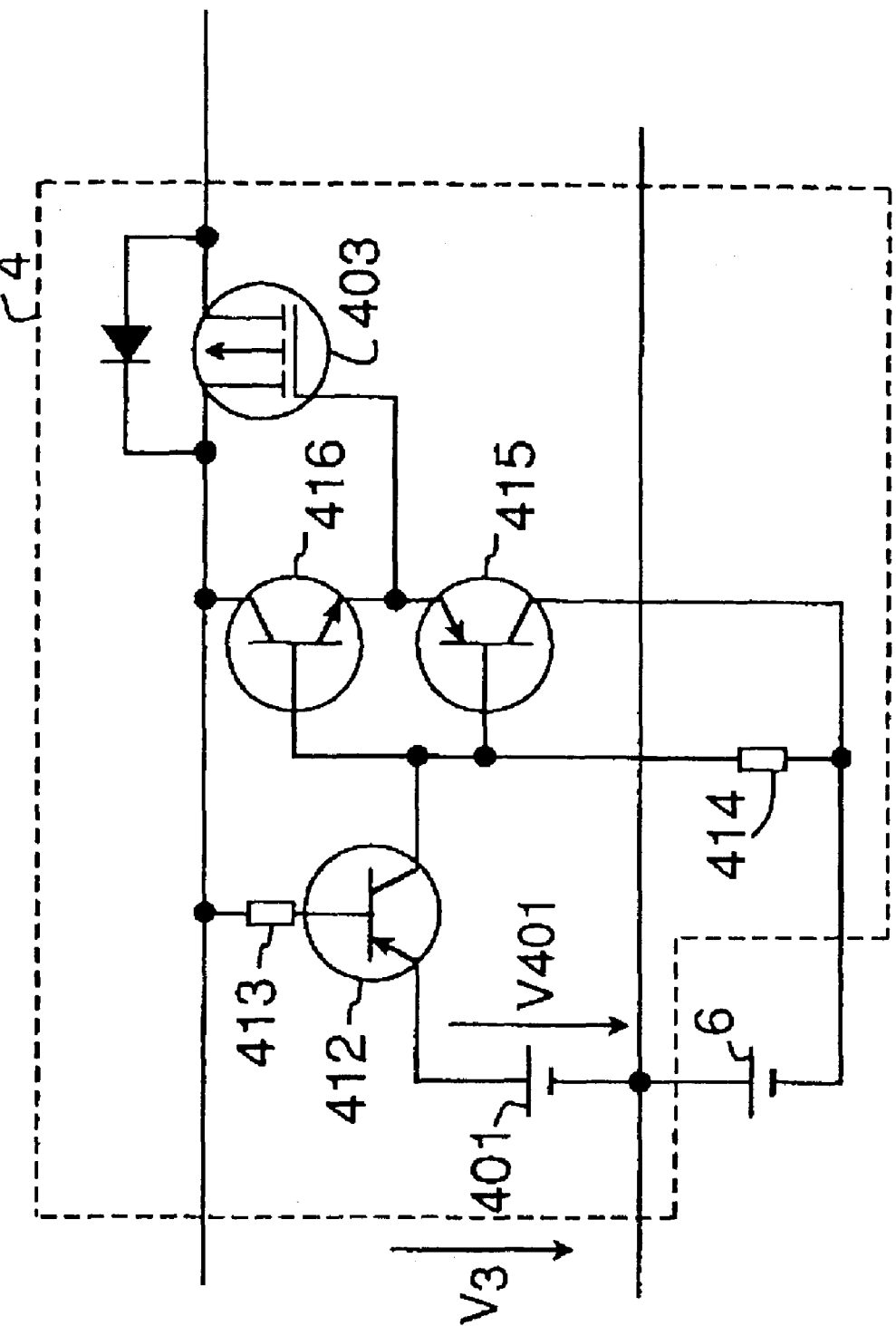
FIG. 14 is a circuit diagram according to the fifth modification.

Referring to FIG. 14, a fifth modification is shown. The current limiter 4 is modified. When compared with the current limiter 4 shown in FIG. 4, the comparator 402 is replaced with three bipolar transistors 412, 415 and 416 and resistors 413 and 414. Other circuit elements in the current limiter 4 of FIG. 14 are the same as those in the current limiter of FIG. 4. Operation is as follows.

Transistor 412 compares it's base-emitter threshold value with a voltage difference between a constant voltage V401 and input voltage V3, and controls the voltage across resistor 414. When the voltage at the base of transistor 412 drops, transistor 412 becomes more conductive to increase the voltage at the base of transistor 416, and eventually increasing the voltage at the emitter of transistor 416. The voltage at the emitter of transistor 416 serves as the adjust signal for adjusting the internal resistance of FET 403. When the adjust signal increases, FET 403 starts to increase the internal resistance, resulting in blocking of the voltage drop at the gate of thyristor 8 in a manner described above in connection with FIG. 4. In this way a very small and cost effective current limiter is realised.

Effect of the Invention

The gate driver according to claim 1 of the present invention realises a low loss small size circuit for high power GCT or RGCT. The use of the pattern generator and switching elements enable a low loss circuit, creating the long high down slope current. Also, no component that takes a high loss is used. One or more MOSFET(s) in the main current path in the current limiter protects circuit components in the down converter.

According to claim 2, the loss in the down converter is reduced by introducing a controlled MOSFET instead of conventional diodes.

According to claim 3, the loss in the down converter is reduced during high down slope current generation by another generation elements optimised for the generation of such current.

According to claim 4, a number of circuit elements can be reduced.

According to claim 5, a number of circuit elements can be reduced, with a simple circuit.

According to claim 6, current limiter protects circuit elements in the down converter particularly during negative GCT gate bias. Also a transition between operations under positive and negative gate bias can be carried out smoothly.

According to claim 7, the current limiter can be arranged with simple circuit and low cost using a high bandwidth power operational amplifier.

According to claim 8, the current limiter can be arranged with simple circuit and low cost using a high bandwidth transistors.

According to claim 9, gate current of the thyristor can be controlled throughout the full range of negative gate voltage with very low loss.

According to claim 10, the turn-on pulse can be generated with simple and small circuit elements. Thus low loss and full protection against negative gate bias can be realized.

According to claim 11, the gate current can be controlled in the full negative gate bias range with low loss even with high gate current.

According to claim 12, the switching of a high load current can be accomplished rapidly and steadily.

What is claimed is:

1. A gate driver for driving a thyristor having an anode, a cathode, and a gate, by providing a gate current to the gate of said thyristor during an on-command signal, said gate driver comprising:

a turn-on pulse generator for generating a turn-on pulse in response to a leading edge of the on-command signal;

a down converter for producing a down slope current immediately following the turn-on pulse; and a current limiter having a MOSFET connected to the gate of said thyristor for supplying current from said down converter to the gate of said thyristor, said current limiter monitoring the gate voltage at the gate of said thyristor and increasing an internal resistance of said MOSFET relative to the A negative voltage increase of the gate voltage.

2. The gate driver according to claim 1, wherein said down converter comprises:

a pattern generator for generating a pattern of a current to be produced from said down converter;

a first conduction pulse generator for generating conduction pulses in accordance with the pattern;

a first switching element for conducting a current from a power source in response to the conduction pulses and producing a first pulse current; and a first inductor for smoothing the first pulse current, said pattern generator generating a pattern having a rising edge and down slope portion after the rising edge, so that the down slope current produced by said down converter decreases relative to the pattern.

3. The gate driver according to claim 2, wherein said down converter further comprises:

a second conduction pulse generator for generating second conduction pulses in accordance with the pattern;

a second switching element for conducting a current from said power source in response to the second conduction pulses and producing a second pulse current; and a second inductor for smoothing the second pulse current so that the down slope current is increased.

4. The gate driver according to claim 2, wherein said down converter further comprises:

a second inductor connected in parallel to the first inductor; and a second switching element connected in series with the second inductor to produce a greater down slope current.

5. The gate driver according to claim 2, wherein said down converter further comprises:

a second inductor connected in parallel with the first inductor; and a saturating reactor element connected in series to the second inductor to produce a greater down slope current.

6. The gate driver according to claim 1, wherein said current limiter comprises:

a comparator for comparing an output voltage at the output of said down converter with a predetermined voltage and producing an adjust signal relative to a difference between the output voltage and the predetermined voltage when the output voltage falls below the predetermined voltage, and said MOSFET receiving the adjust signal to change its internal resistance relative to the adjust signal.

7. The gate driver according to claim 6, wherein said comparator comprises an operational amplifier.

8. The gate driver according to claim 6, wherein said comparator comprises bipolar transistors.

9. The gate driver according to claim 6, wherein said current limiter further comprises a freewheel diode connected in parallel with said MOSFET.

10. The gate driver according to claim 1, wherein said turn-on pulse generator comprises a capacitor, a diode connected in parallel with said capacitor, a switching element, and a reactor to produce a pulse.

11. The gate driver according to claim 1, further comprising a bias current generator providing a bias current to the gate of said thyristor.

12. The gate driver according to claim 1, wherein said thyristor is a GCT.

* * * * *